United States Patent [19]
Linsky

[11] Patent Number: 5,483,541
[45] Date of Patent: Jan. 9, 1996

[54] PERMUTED INTERLEAVER

[75] Inventor: Stuart T. Linsky, San Pedro, Calif.

[73] Assignee: TRW Inc., Redondo Beach, Calif.

[21] Appl. No.: 120,715

[22] Filed: Sep. 13, 1993

[51] Int. Cl.$^6$ .................................................. G06F 11/00
[52] U.S. Cl. ................................ 371/2.1; 371/43; 371/45; 371/39.1
[58] Field of Search .............................. 371/1, 40.1, 40.3, 371/2.1, 38.1, 39.1, 43, 44, 45; 364/862, 825, 819, 574, 553; 375/1, 7

[56]  References Cited

U.S. PATENT DOCUMENTS

| | | | |
|---|---|---|---|
| 4,164,023 | 8/1979 | Whitehouse et al. | 364/862 |
| 4,291,406 | 9/1981 | Bahl et al. | 371/44 |
| 4,394,642 | 7/1983 | Currie et al. | 371/40.3 |
| 4,425,644 | 1/1984 | Scholz | 371/40.1 |
| 4,459,696 | 7/1984 | Kojima | 371/40.3 |
| 4,547,887 | 10/1985 | Mui | 375/1 |
| 5,042,033 | 8/1991 | Costa | 371/2.1 |
| 5,056,105 | 10/1991 | Darmon et al. | 371/2.1 |
| 5,136,588 | 8/1992 | Ishijima | 371/2.1 |
| 5,173,902 | 12/1992 | Darmon et al. | 371/2.1 |

Primary Examiner—Emanuel T. Voeltz
Assistant Examiner—Kyle J. Choi

[57] ABSTRACT

A permuted interleaver/deinterleaver system for interleaving the bits of a digital communications system such that bursts of error bits are separated for more effective communications. The interleaver/deinterleaver system includes an interleaver and deinterleaver having a number of permuted rows of shift registers. The arrangement of the shift registers in the interleaver and deinterleaver can be determined by a permute number calculated in accordance with a specific communications implementation. As bits are input into the shift register of the interleaver, bits are output from the interleaver in order to establish a sequence of permuted data bits. A rotating switching mechanism systematically selects output bits from the shift register of the interleaver and applies the bits to a channel modulator/demodulator. The deinterleaver accepts the bits from the channel and restores the original bit order.

19 Claims, 5 Drawing Sheets

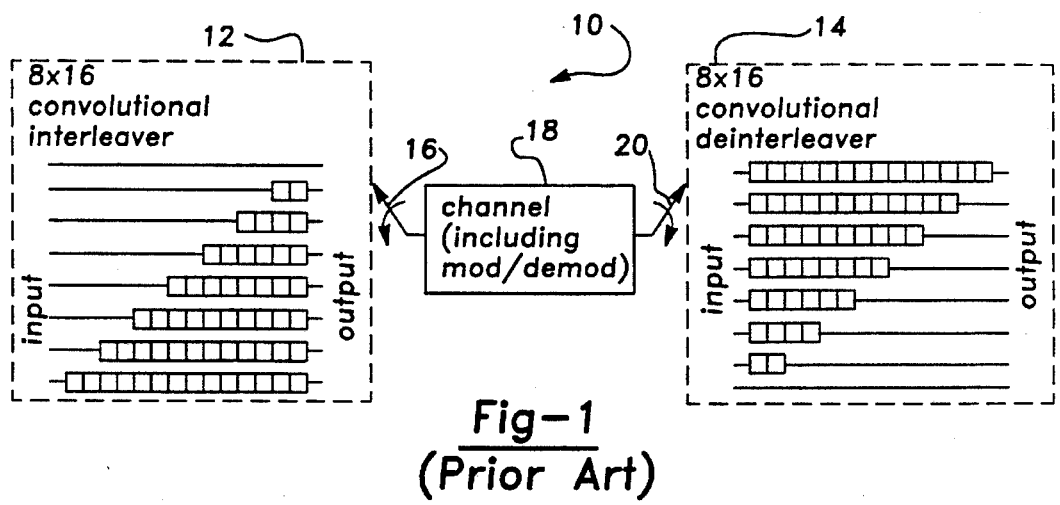
Fig-1
(Prior Art)
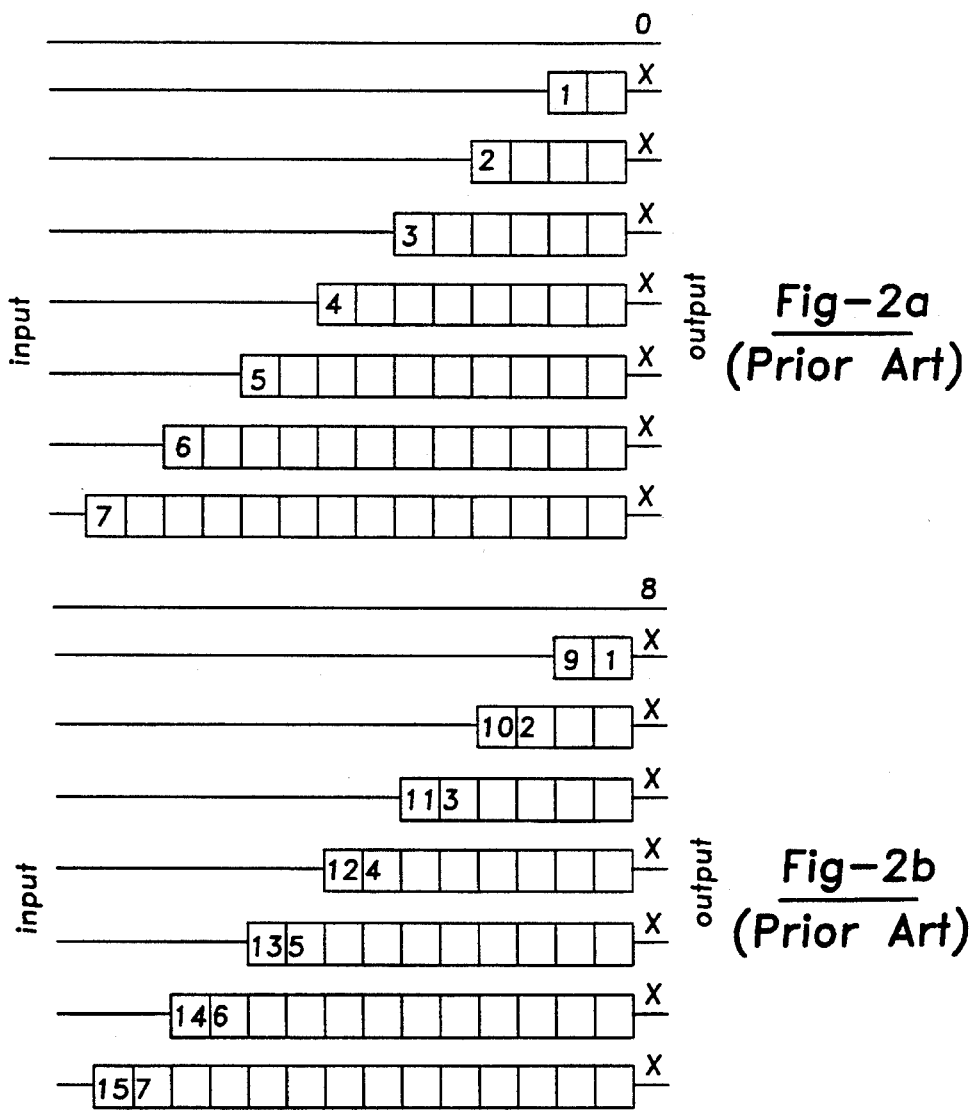
Fig-2a
(Prior Art)
Fig-2b
(Prior Art)

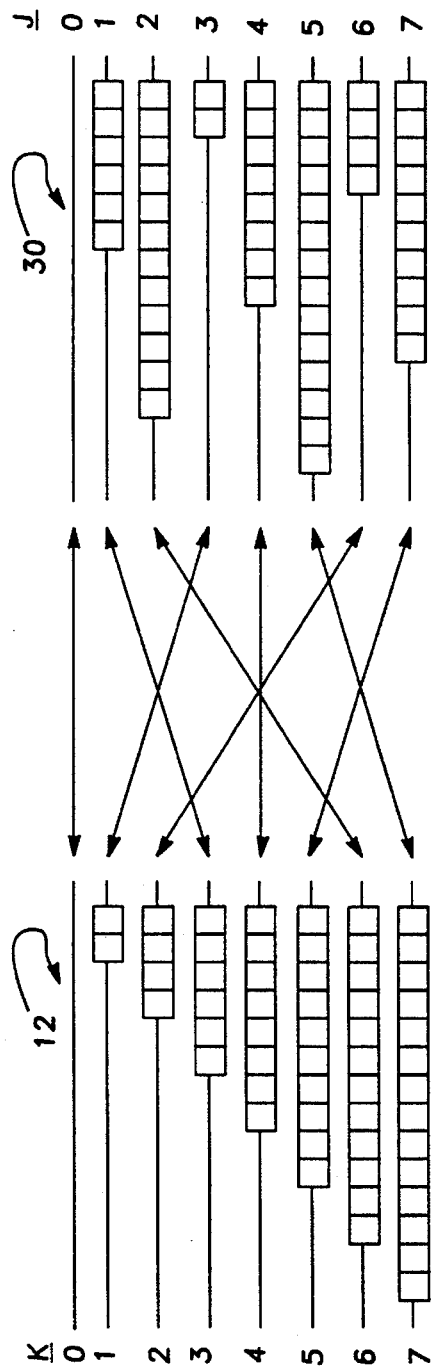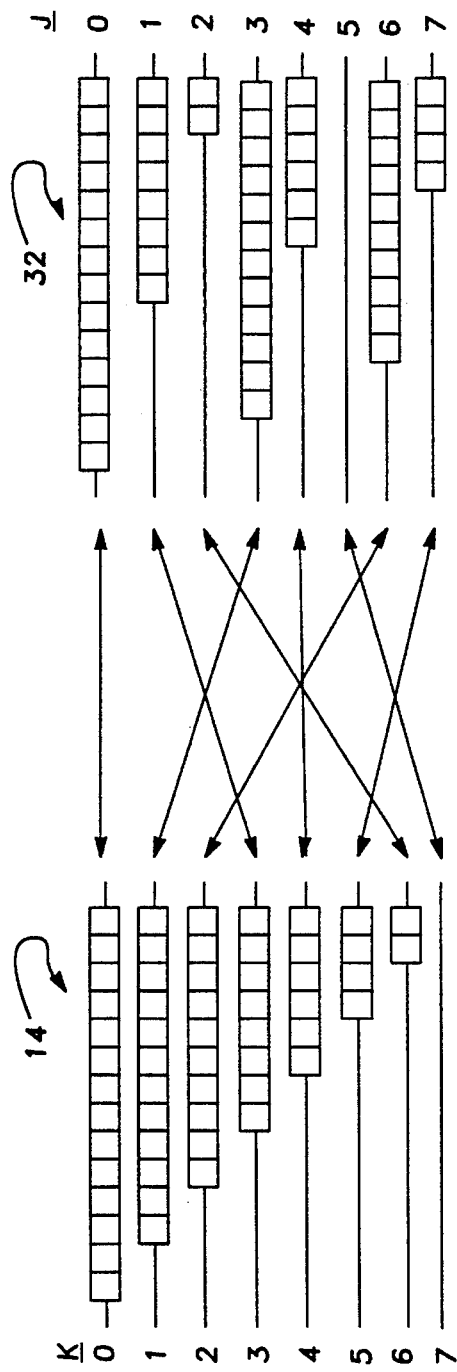
Fig-4a
Fig-4b

1

PERMUTED INTERLEAVER

The U.S. government has a paid-up license in this invention and the right in limited circumstances to require the patent owner to license others on reasonable terms as provided for by the terms of Contract No. J8-599650-XEC awarded by the Air Force.

BACKGROUND OF THE INVENTION

1. Field of the Invention

This invention relates generally to a communications system incorporating an interleaver and, more particularly, to a digital communications coding system incorporating a permuted interleaver.

2. Discussion of the Related Art

Heavy demands are required on many different types of digital communication channels. Many times in these communication channels, a relatively large amount of bit errors may occur in a sequence of transmitted bits in a relatively short period of time. Errors occurring in this manner are generally referred to as error bursts, and hence, the channel is referred to as a bursty channel. Communication channels which may include error bursts of this type include scintillating channels, jam channels, ionosphere communications channels, or high interference channels. Additionally, the causes of error bursts can vary from one terminal type to another terminal type.

In bursty communications channels interleaving of the data bits is generally incorporated in order to make the communications more reliable. As is known in the art, interleaving is a process by which bit errors are decorrelated and separated from one another such that they can be more efficiently isolated and processed in an encoding and decoding communications process. The longer the duration of error bursts in a channel, the longer interleaving is required. However, longer interleaving requires additional information delay. Longer information delay degrades the quality of real time signals such as two way voice communications. An interleaver which separates errors the most for a fixed delay can greatly improve communications in bursty channels.

Conventional interleavers typically fall into three categories. These categories include block, convolutional and hybrid interleavers. Convolutional interleaving is currently the most widely accepted data interleaving scheme although the same concepts apply to all interleaving techniques. A typical convolutional interleaver design will guarantee that any encoded burst of errors of a particular burst length (BL) less than a predetermined number of bits (L) will be spread out so that these errors are at least a certain number of bits (D) apart when they reach the decoder input. The parameters D and L are dependent on the design of the interleaver. Bit error rate (BER) performance generally gets better as D and L get larger. However, this is at the cost of increasing communications delay. If a burst of errors lasts longer than the L number of bits supported by a particular interleaver design, then the errors will arrive at the decoder closer together than the number D bits normally maintained as a minimum separation by the interleaver.

The parameter D is generally determined by the specifics of the coding being used and by the desired level of BER performance. The parameter L is then determined by the interleaver designer. The choice of the parameter L is primarily driven by the expected channel burst length statistics in the allowable communications delay. Therefore, the total size and communications delay of the interleaver is proportional to (D×L). Therefore, if D must be large and the communications delay must be minimized in order to provide both reliable and fast communications, L must also be minimized. Since it is not always possible to make L larger than the longest expected burst of errors, performance of the interleaver for burst lengths greater than L will affect BER performance.

One problem attributable to the standard convolutional interleaver is that the separation of errors at the encoder input does not decrease slowly or steadily whenever the length of an error burst exceeds the interleaver value of L. For example, suppose that a particular interleaver design sets $D=D_1$ and $L=L_1$. If a burst of errors last longer than $L_1$ bits, the errors will not be separated by at least $D_1$ bits when they reach the decoder input. In fact, some of the errors will be separated by only one bit. In other words, the minimum separation of burst errors reached in the decoder input degrades from $D_1$ to 1 as soon as the burst length exceeds $L_1$.

What is needed then, is an interleaver design which not only provides the necessary separation of bit errors in a bursty communication channels during times when the burst of channel errors exceeds a predetermined number of bits, but in which the integrity of the interleaving process is substantially maintained during times when the bit error rate exceeds this number of bits. It is therefore an object of the present invention to provide such an interleaver.

SUMMARY OF THE INVENTION

In accordance with the teachings of the present invention, a permuted convolutional interleaver is disclosed. From this, permuted block and hybrid interleavers will logically follow. The permuted interleaver is first defined similar to the standard convolutional interleaver in that a series of rows of shift registers are incorporated having from zero to some predetermined number of bits depending on the interleaver design. Next, a permutation is defined in accordance with the design parameters of the particular communications system being employed. The permutation influences the error separation of the interleaving process. The number of the row of each shift register in the convolutional interleaver is permuted, and the resulting number is the row assignment for that shift register in order to rearrange the rows of shift registers into a permuted array. The permutation is also used to define a deinterleaver in order to rearrange the bits in the same alignment as before the interleaving process.

Communication bits are introduced into the interleaver in the order of the rows from a topmost shift register to a bottom most shift register such that the first bit location in each row receives a first number of bits in association with the number of shift registers. The next input of bits is applied to the next series of shift registers in accordance with the number of shift registers. As a bit is input into a shift register, an output bit is outputted from that shift register such that the input data bits are realigned in a permuted fashion, thus separating the errors in a burst of errors. The deinterleaver rearranges the bits back into their original alignment.

Additional objects, advantages, and features of the present invention will become apparent from the following description and appended claims taken in conjunction with the accompanying drawings.

BRIEF DESCRIPTION OF THE DRAWINGS

FIG. 1 is a prior art representation of a convolutional interleaver/deinterleaver system;

FIGS. 2(A)–2(D) is a prior art representation of the introduction of digital data bits into the convolutional interleaver/deinterleaver system of FIG. 1;

FIGS. 4(A)–4(B) is a representation of how the interleaver and deinterleaver of FIG. 3 is permuted from a convolution interleaver and deinterleaver.

DETAILED DESCRIPTION OF THE PREFERRED EMBODIMENTS

Figure 2C:
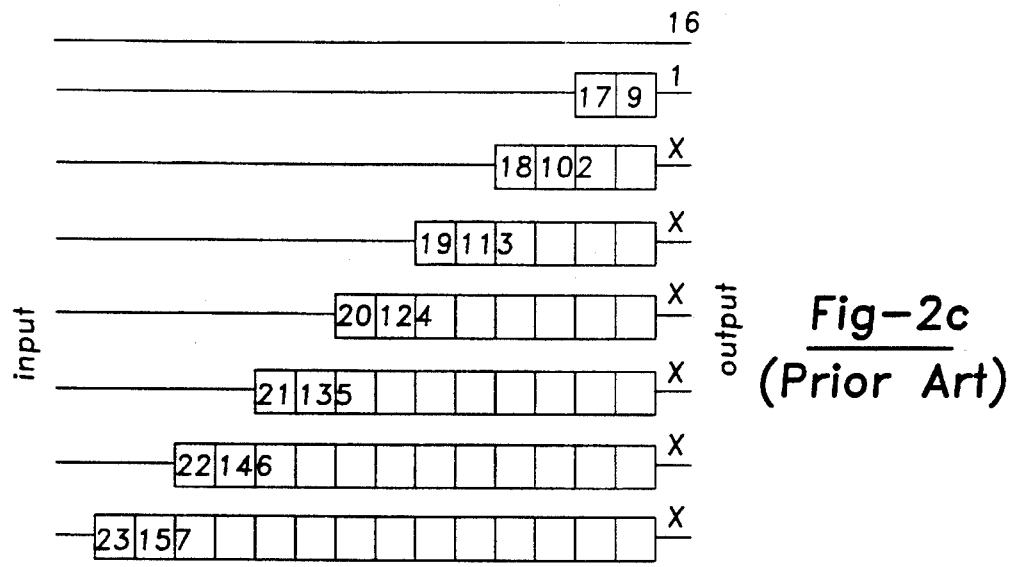

The following description of the preferred embodiments concerning a permuted convolutional interleaver/deinterleaver system is merely exemplary in nature and is in no way intended to limit the invention or its applications or uses.

Turning to FIG. 1, a depiction of a conventional convolutional interleaver/deinterleaver system 10 is shown. The system 10 would be part of a bursty communications channel for a particular communications network as would be well understood in the art. The interleaver/deinterleaver system 10 includes an 8×16 convolutional interleaver 12 and an 8×16 convolutional deinterleaver 14. The interleaver 12 and the deinterleaver 14 are both 8×16 devices in that D=8 and L=16. In this design, the interleaver 12 and the deinterleaver 14 have eight rows, where each row includes an even number of bit locations starting from zero and ending with fourteen as represented by the boxes. There is also a bit location at the right hand side of each row. Each row represents a shift register of a predetermined length. In a real application, the interleaver and deinterleaver will have many more rows determined by a specific design code being used. Typically, the number of rows is on the order of sixty-four with the corresponding number of bit locations. As is apparent, the rows are arranged in an ascending number of bit locations from the top row down.

Encoded communication bits are read into the inputs of the rows at the left-hand side of the interleaver 12. Interleaved encoded output bits are read out from the right-hand side of the interleaver 12. As one bit is read into the input in each row, another bit is read out of that row. A rotating switch 16 selects an output bit from the shift register rows in a systematic manner and applies the bits to a channel modulator/demodulator 18. The channel modulator/demodulator could be any known modulator/demodulator for the appropriate communication system. The rotating switch 16 starts at the top row and cycles through each of the eight rows in a continuous fashion. Therefore, the bits inputted into the interleaver 12 are rearranged into an interleaved pattern.

The deinterleaving process is simply the reverse of the interleaving process. A rotating switch 20 receives the bits from the channel modulator/demodulator 18 and systematically applies them to a selected row of the deinterleaver 14. One channel bit is input into each row of the deinterleaver 14 on the left-hand side of the deinterleaver 14, starting with the top row. As one bit is input into a row, a previous bit in that row is outputted. The bits are read out of each row at the outputs of the deinterleaver row registers on the right-hand side of the deinterleaver 14. The arrangement of the rows in the deinterleaver 14 is opposite to that of the interleaver 12 in that the top most row in the deinterleaver has the most bit locations and the bottom most row has the least bit locations. Therefore, a row in the interleaver 12 and the corresponding row in the deinterleaver 14 have the same number of bits as each other row. The deinterleaver 14 thus restores the original bit order of the encoded bits as inputted to the interleaver 12. In this manner, the interleaver/deinterleaver system 10 separates bit errors for sending along a communication channel.

Figure 2D:
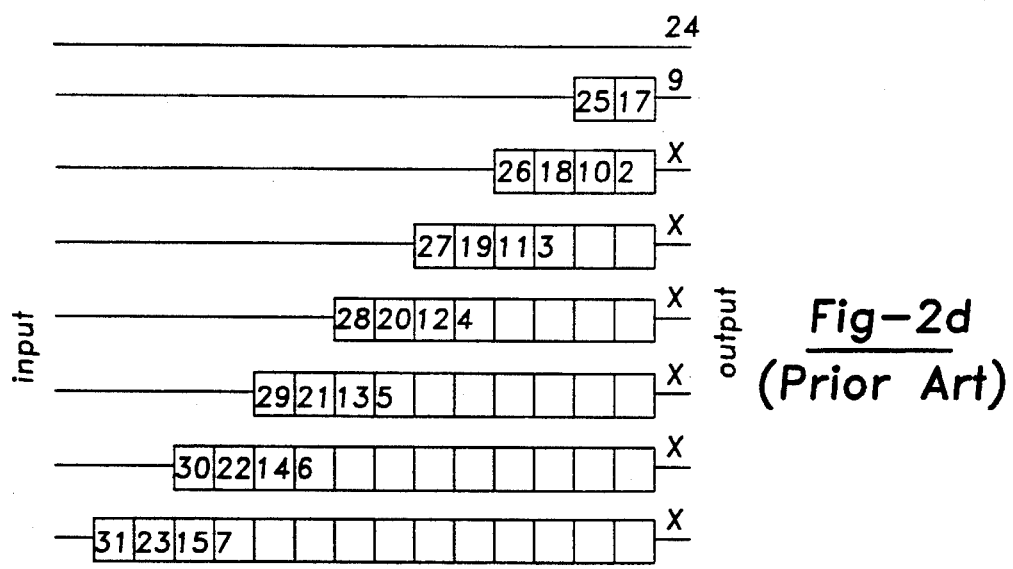

FIG. 2 shows the manner in which the encoded data bits are shifted through the interleaver 12. As shown in FIG. 2(A), the first eight encoded bits (bits 0–7) are shifted into the left-most bit location in each of the eight shift registers in a descending order from the topmost shift register to the bottom-most shift register. The X bits represent invalid data bits that were present in the interleaver shift registers when the interleaver 12 was initialized. At the second input cycle, as shown in FIG. 2(B), the next eight encoded bits (bits 8–15), have been shifted into the left-most bit locations for each of the eight shift registers, as shown, such that the first bit for each row has been moved right one location. The zero bit at the top shift register has been shifted out after the second cycle. FIGS. 2(C) and (D) show the bit locations after the third and fourth input cycle of eight bits, respectively. The bit order at the input of the interleaver 12 is 0, 1, 2, 3, 4, 5 . . . After four input bit cycles, the output bit order at the input to the channel modulator/demodulator 18 would be 0, X, X, X, X, X, X, X, 8, X, X, X, X, X, X, 16, 1, X, X, X, X, X, X, 24, 9, X, X, X, X, X, X . . . As is apparent, it would take sixteen input cycles before the invalid X data bits are purged from the interleaver 12.

Figure 3:
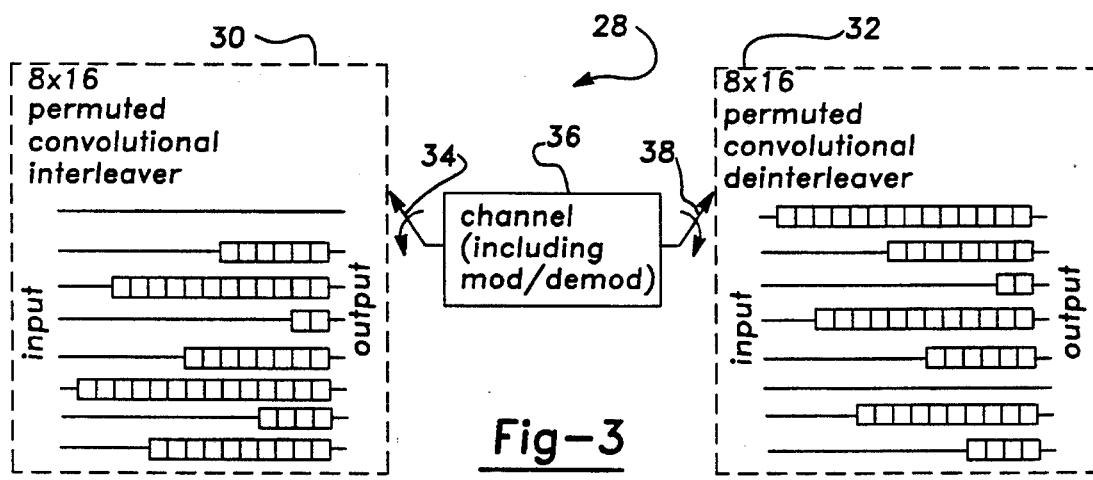
FIG. 3 is a representation of an interleaver/deinterleaver system in accordance with a preferred embodiment of the present invention.

FIG. 3 shows an interleaver/deinterleaver system 28, according to a preferred embodiment of the present invention. In the system 28, an 8×16 permuted convolutional interleaver 30 and an 8×16 permuted convolutional deinterleaver 32 are incorporated. Also included are a rotating switch 34, a channel modulator/demodulator 36 and a rotating switch 38 used in the same manner as the similar components as discussed above. The system 28 takes the same interleaver/deinterleaver structure as system 10, but changes the order of the rows of shift registers. In other words, each of the rows of the interleaver 30 and the deinterleaver 32 are rearranged such that the number of bit locations in the rows are mixed up with respect to the system 10 of FIG. 1. In this manner, the number and lengths of the shift registers remains the same, but their configuration is permuted.

The order of the rows of the shift registers in the interleaver 30 and the deinterleaver 32 is determined by permuting the row numbers to optimize performance with the channel statistics and code being used. In one example, the rows are first numbered, as in a standard convolutional interleaver, as 0 through $N_1-1$ from a top row position, where $N_1$ is the number of rows in the interleaver. For the interleavers 12 and 30, $N_1=8$. Note that the 0th row is the top row. The order of the rows is then permuted to form the rows of the permuted interleaver 30. The Jth row of the permuted interleaver will come from the Kth row of the standard convolutional interleaver, where $K=(J\times P)_{modulo\ N_1}$. P is referred to as the "permute number" of the permuted interleaver, and is a design parameter that is chosen to optimize performance. P is a fixed integer for any given interleaver design and its value influences the error separation at the deinterleaver output for error bursts longer than L bits.

FIG. 4(A) shows a graphical representation of how the standard convolutional interleaver 12 is transformed into the permuted convolutional interleaver 30. Likewise, FIG. 4(B)

shows how the standard convolutional deinterleaver 14 is permuted into the permuted convolutional interleaver 32. Note that the rows are labeled K for the standard convolutional interleaver/deinterleaver pair and the rows are labeled J for the permuted convolutional interleaver/deinterleaver pairs.

In one specific example, P is chosen to be three. Then, from the equation $K=(J\times P)_{modulo\ N1}$ above, the 0th row of the permuted interleaver 30 is the 0th row of the standard convolutional interleaver 12. The first row of the permuted interleaver 30 is the third row of the standard interleaver 12, as $K=(1\times 3)_{modulo\ 8}$. The second row of the permuted interleaver 30 is the sixth row of the standard interleaver 12, as $K=(2\times 3)_{modulo\ 8}$. The third row of the permuted interleaver 30 is the first row of the standard interleaver 12, as $K=(3\times 3)_{modulo\ 8}$. The same process is performed up to J=7 for all of the rows of the permuted interleaver 30. The following chart shows how the (J×3) value determines which of the Kth row becomes the Jth row by the Modulo process.

| K | | (J × 3) |
|---|---|---|
| 0 | ←←←←modulo 8←←←← | 0 |
| 1 | | |
| 2 | | |
| 3 | ←←←←modulo 8←←←← | 3 |
| 4 | | |
| 5 | | |
| 6 | ←←←←modulo 8←←←← | 6 |
| 7 | | |
| 0 | | |
| 1 | ←←←←modulo 8←←←← | 9 |
| 2 | | |
| 3 | | |
| 4 | ←←←←modulo 8←←←← | 12 |
| 5 | | |
| 6 | | |
| 7 | ←←←←modulo 8←←←← | 15 |
| 0 | | |
| 1 | | |
| 2 | ←←←←modulo 8←←←← | 18 |
| 3 | | |
| 4 | | |
| 5 | ←←←←modulo 8←←←← | 21 |

Further, the same process is followed to set the rows of the permuted deinterleaver 32. It is noted that P must be selected such that the permuted interleaver 30 ends up containing all the rows of the standard interleaver 12 in a permuted order. This means that the permute number, and the total number of rows, must be relatively prime, i.e. the greatest common divisor of P and $N_1$ is 1.

This example of permuting the rows has a heuristic viewpoint. In the standard convolutional interleaver the rows monotonically increase in delay, so the separation in time between output bits is limited. To convert to the permuted interleaver, the rows of the standard convolutional interleaver are divided into h blocks of j contiguous rows (the last block may have fewer than j). Next, take the first row of each block in order as the first h rows of the permuted interleaver, then take the second row of each block in order as the second h rows of the permuted interleaver, etc. Depending on the exact numerology between $N_1$, h and j, the precise row ordering may change, but the heuristic idea of interlacing rows from the h blocks remains. In this method the permute number P is equal to j. This indicates that the choice for P is guided by how many blocks the interleaver should be broken into for best performance. In this regard, the permute number, $P \approx N_1/h$, (note that P cannot be exactly equal to N1/h as discussed above). This method of permuting the rows is exemplary only.

Figure 5A:
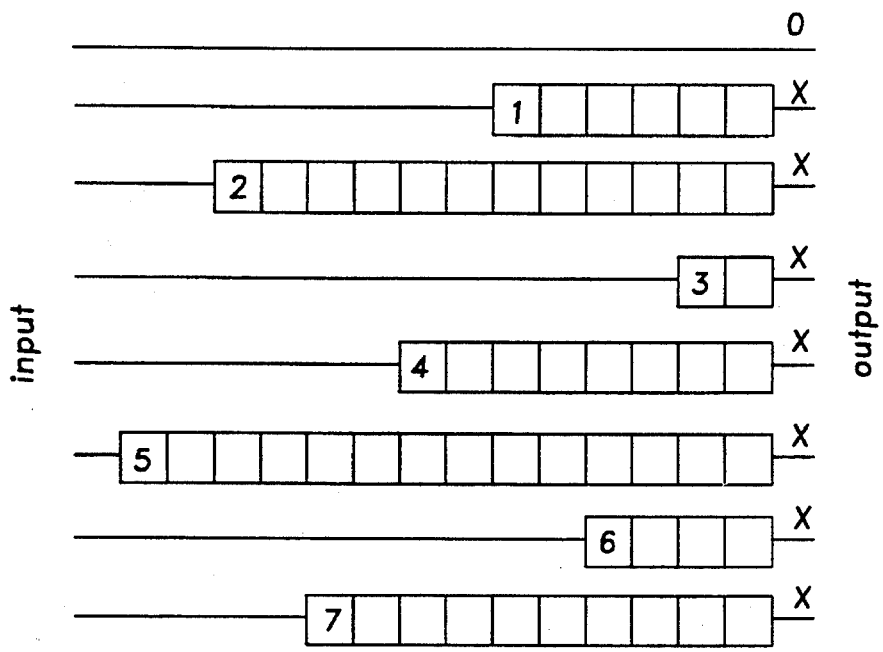
FIGS. 5(A)–5(D) is a representation of the input data bits of the interleaver/deinterleaver system of FIG. 3 over four input cycles.
Figure 5B:
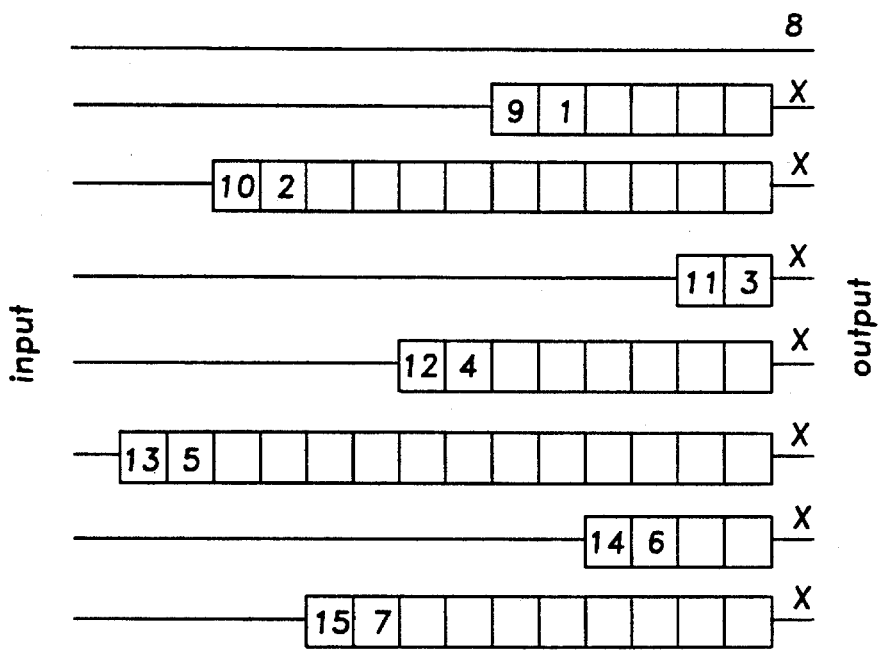
Figure 5C:
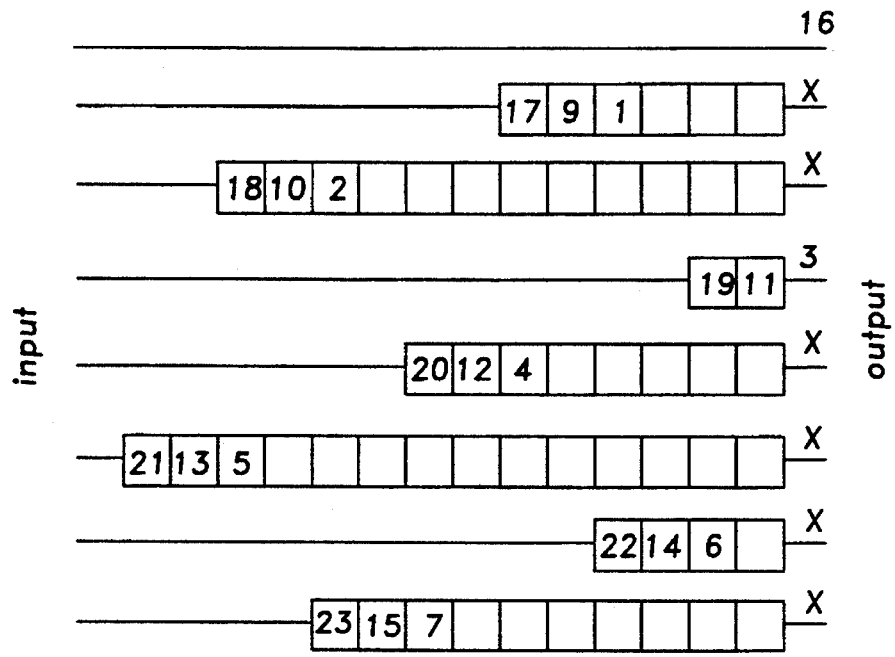
Figure 5D:
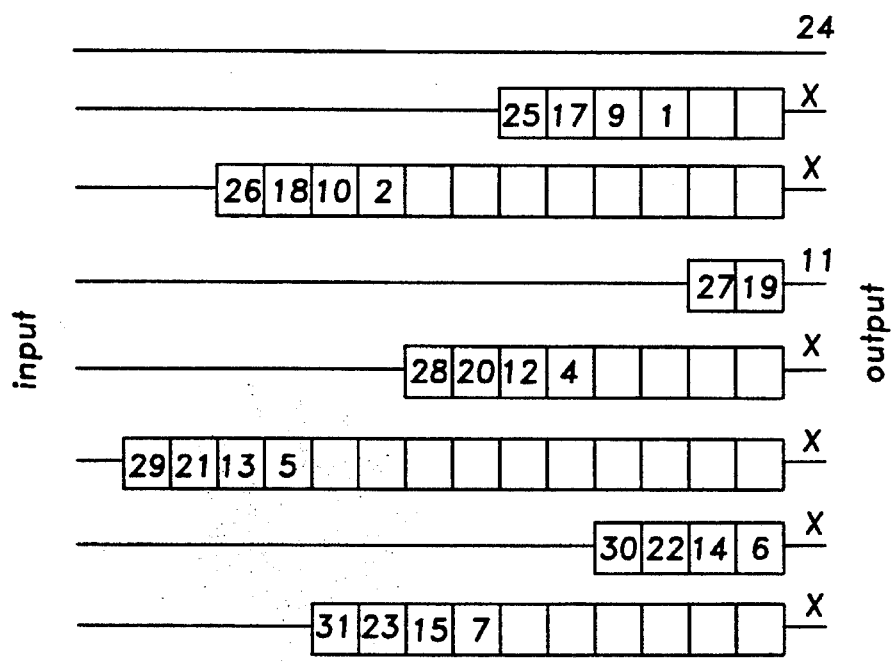

Once the rows of the permuted interleaver 30 are selected, the bits are read into and out of the interleaver 30 in the same manner as that for the standard interleaver 12. That is, one bit is read into the input of each row of the interleaver 30 starting with the top row. After one bit has been read into the input of each row, a bit is read onto the channel modulator/demodulator 36 from the output of each row through the switch 34. This cycle is then repeated as discussed above with respect to FIG. 2. FIGS. 5(A)–(D) illustrates this process by showing the state of the registers of the permuted interleaver 30 at the end of each of four input cycles. After one cycle, as shown in FIG. 5(A), the left-most bit location for each shift register row is filled with the appropriate input bits 0–7 in a descending order of rows. FIG. 5(B) shows the bit locations after the second input cycle of bits 8–15; FIG. 5(C) shows the bit locations after the third input cycle of bits 16–23; and FIG. 5(D) shows the bit locations after the fourth input cycle of bits 24–31. The order of the bits at the interleaver 30 input is 0, 1, 2, 3, 4, 5 . . . The order of output bits at the channel modulator/demodulator 36 after the fourth input cycle is 0, X, X, X, X, X, X, X, 8, X, X, X, X, X, X, 16, X, X, 3, X, X, X, X, 24, X, X, 11, X, X, X, X . . . By comparing the output bit pattern for FIGS. 2(D) and 5(D), it is apparent that the bits are more separated for the permuted interleaver 30 than for the interleaver 12.

The rows of the permuted deinterleaver 32 are obtained in exactly the same manner as the rows of the permuted interleaver 30. In this manner, the rows of the permuted deinterleaver 32 must fit the rows of the interleaver 30 such that the total number of shift register delay elements in any row of the interleaver 30 plus the total number of shift register delay elements in the same row of the deinterleaver 32 must be the same for all rows.

The interleaver/deinterleaver system 28 represents a particular structural implementation of a particular convolutional permuted interleaver. However, there are other ways in which an interleaving/deinterleaving system can be tailored to different implementations without departing from the interleaving/deinterleaving process. Because the particular structure given in the discussion above may not fit a given implementation, a more general description of the permuted interleaving/deinterleaving process will be given.

Another way to describe the interleaving process is to say that each encoded bit received at an interleaver input will be transmitted on the channel after being delayed by a specific amount that varies with each bit. For example, if the interleaver 12 transmits the 0th bit received from an encoder (not shown) with no delay at all, then the next bit is delayed by sixteen bits before being transmitted on the channel. The next bit is delayed by thirty-two bits before being transmitted on the channel, and so on. For a standard convolutional interleaver of dimensions $N_1 \times N_2$, the ith input bit is delayed before transmission by:

$$DELAY=d=[(iN_1)\times N_2]bits.$$

For the modified interleaving process, these delays are simply permuted. Hence, for a permuted interleaver of dimensions $N_1 \times N_2$ and a permute number of P, the ith input bit is delayed before transmission by:

$$DELAY=d_p=[(i\times P)N_1\times N_2]bits.$$

One way to implement an interleaver is to write encoded bits into a physical memory by address location and subsequently read them out of the memory from these same address locations, but in a different order. The above equations can be easily modified to directly give these address locations. For example, let the interleaver input addresses be sequential, starting with the location $INADDR_{INT}(0)=0$. If the interleaver's memory size is M bits, the ith input bit is written to a memory address given by:

$$INADDR_{INT}(i)=(i)_M.$$

The ith output bit can be read from an address given by:

$$OUTADDR_{INT}(i)=(M+i-d_p)_M.$$

The deinterleaver equations are simply reversed to get:

$$INADDR_{DEINT}(i)=(M+i-d_p)_M;$$

and $$OUTADDR_{DEINT}(i)=(i)_M.$$

Some hardware implementations of interleavers may be constrained to read and write in bytes. Permuted interleavers/deinterleavers can be set up for this situation, although different parameters must be introduced. The equations for delay are similar to the ones set forth above:

$$DELAY=d_p=[(i\times P_1)N_1+((i-(i)_B)\times P_2)N_{1/b}]\times N_2,$$

where, $P_1$ is the first permute number,
$P_2$ is the second permute number, and
B is the word size in bits.

If this delay is used, the above equations for input and output addresses will generate the correct addresses for a consistent set of interleaver/deinterleavers. $P_1$ and $P_2$ are chosen to optimize the performance of the interleaving process.

The modified implementation of the permuted interleaver/deinterleaver may be implemented by using a standard convolutional interleaver and deinterleaver design. If the order of the encoded bits at the input to a standard convolutional interleaver is permuted, the interleaver output will have the characteristics of a permuted interleaver design. For example, the following equation could be used to reorder the bits at the input to a standard interleaver. Let i be an index of the order of the bits as they come out of encoder. That is, i=0 for the first bit out of the encoder, i=1 for the next bit, i=2 for the next bit, etc. Let $i_p$ be the index of the permuted bits at the input to a standard interleaver. Then, $$i_p=(i-(i)N_1)+(i\times P)N_1,$$

where P is a permute number chosen to optimize the interleaver performance. This operation repeats itself after $N_1$ bits, and could be implemented over a span of $N_1$ bits without regard to the order of bits outside this span. The inverse of this operation must be performed at the deinterleaver output.

With an appropriate choice of parameters for specific implementations, the implementation as described above can achieve equivalent performance. However, these different implementations are not completely equivalent in terms of bit input and output. An interleaver using one of the above implementations cannot be used with a deinterleaver using another of the implementations. These different implementations are given here to illustrate the different approaches that are possible with the permute process.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A permuted interleaving system comprising:
   an interleaver positioned to accept input data bits, said interleaver including an array of rows of shift registers where each shift register includes a predetermined number of bit locations, said array of rows of shift registers being arranged in configuration that is a permuted arrangement of an array of rows of shift registers of a convolutional interleaver; and
   means for selectively accepting output data bits from the rows of shift registers in a sequential manner and applying the output bits to a communications channel such that the output bits from the shift registers are arranged in a permuted sequence.

2. The permuted interleaving system according to claim 1 wherein the means for selectively accepting is a rotating switch for continuously and systematically selecting the output bits from the rows of shift registers and applying them to a channel modulator/demodulator.

3. The permuted interleaving system according to claim 1 further comprising a deinterleaver, said deinterleaver including an array of rows of shift registers arranged in accordance with the permuted fashion of the interleaver where each shift register row of the interleaver and a corresponding shift register row of the deinterleaver have the same number of bit locations as each of the other shift register rows of the interleaver and corresponding shift register row of the deinterleaver such that the permuted sequence of bits are input into the shift registers of the deinterleaver and the deinterleaver outputs the data bits in substantially the same order as they were input into the interleaver.

4. The permuted interleaving system according to claim 3 further comprising means for selectively inputting bits from a channel modulator/demodulator into the rows of shift registers of the deinterleaver.

5. The permuted interleaving system according to claim 1 wherein the arrangement of permuted shift registers is determined by a permute number, said permute number being selected in accordance with specific design parameters of a communications system incorporating the interleaving system.

6. The permuted interleaving according to claim 5 wherein the permuted rows of the interleaver are determined by $K=(J\times P)_{modulo\ N1}$, where K is a Kth row of a standard convolutional interleaver, J is a Jth row of the permuted interleaver, P is the permute number and N1 is the number of rows in the interleaver.

7. A permuted interleaving system comprising:
   an interleaver positioned to accept input data bits, said interleaver including an array of rows of shift registers arranged in a configuration that is a permuted arrangement of an array of rows of shift registers of a convolutional interleaver;
   a first rotating switch means for systematically selecting output bits from the rows of shift registers and applying them to a channel modulator/demodulator in a permuted sequence;
   a second rotating switch means for receiving the permuted sequence of bits from the channel modulator/demodulator; and
   a deinterleaver positioned to accept the permuted sequence of bits from the second rotating switch means, said deinterleaver including an array of rows of shift registers arranged in accordance with the permuted fashion of the interleaver where each shift register row of the interleaver and a corresponding shift register row of the deinterleaver have the same number of bit locations, such that a sequence of output bits from the shift registers of the deinterleaver are in substantially the same order as the order of bits inputted into the interleaver.

8. The permuted interleaving system according to claim 7 wherein the arrangement of permuted shift registers is determined by a permute number, said permute number being selected in accordance with specific design parameters of a communication system incorporating the interleaving system.

9. The permuted interleaving system according to claim 8 wherein the permuted rows of the interleaver are determined by $K=(J \times P)_{modulo\ N1}$, where K is a Kth row of a standard convolutional interleaver, J is a Jth row of the permuted interleaver, P is the permute number and N1 is the number of rows in the interleaver.

10. A method of interleaving data bits, said method comprising the steps of:

providing an interleaver including an array of rows of shift registers arranged in a configuration that is a permuted arrangement of an array of rows of shift registers of a convolutional interleaver; and selectively accepting output data bits from the rows of shift registers in a sequential manner and applying the output bits to a communication channel such that the output bits from the shift registers are arranged in a permuted sequence.

11. The method according to claim 10 wherein the step of providing a permuted interleaver includes providing a permuted interleaver in which the shift registers are permuted in accordance with a permute number determined from specific design parameters of a communication system incorporating the interleaving system.

12. The method according to claim 11 wherein the permuted rows of the interleaver are determined by $K=(J \times P)_{modulo\ N1}$, where K is a Kth row of a standard convolutional interleaver, J is a Jth row of the permuted interleaver, P is the permute number and N1 is the number of rows in the interleaver.

13. The method according to claim 10 wherein the step of selectively accepting output data bits from the rows of shift registers includes applying the output data bits to a rotating switch for continuously and systematically selecting the output bits from the rows of shift registers and applying them to a channel modulator/demodulator.

14. The method according to claim 10 further comprising the steps of providing a deinterleaver including an array of rows of shift registers arranged in accordance with the permuted fashion of the interleaver where each shift register row of the interleaver and a corresponding shift register row of the deinterleaver have the same number of bit locations, and applying the permuted sequence of data bits into the shift registers of the deinterleaver in a systematic fashion such that an output of the deinterleaver is in substantially the same sequence as the input to the interleaver.

15. The method according to claim 14 wherein the step of applying the permuted sequence of data bits includes using a rotating switch for continuously and systematically applying the sequence of data bits to the array of rows of shift registers of the deinterleaver.

16. A permuted interleaving system comprising:

means for establishing a sequence of data bits;

interleaving means for permuting the sequence of data bits in order to establish a permuted sequence of data bits, said interleaver means including a plurality of rows of bit locations that store the data bits where each row includes a predetermined number of bit locations, said rows of bit locations being arranged in a configuration that is permuted rows of bit locations of a convolutional interleaver; and deinterleaving means for reordering the permuted sequence of data bits into substantially the same sequence as before the data bits were permuted.

17. The permuted interleaving system according to claim 16 wherein the interleaving means is an array of rows of shift registers arranged in a permuted fashion with respect to the bit locations in each row and the deinterleaver means is an array of rows of shift registers arranged in accordance with the permuted fashion of the interleaver, wherein each shift register row of the interleaver and a corresponding shift register row of the deinterleaver have the same number of bit locations as each of the other shift register rows of the interleaver and corresponding shift register rows of the deinterleaver such that the permuted sequence of bits are input into the shift registers of the deinterleaver and the deinterleaver outputs the data bits in substantially the same order as they were input into the interleaver.

18. The permuted interleaving system according to claim 16 wherein the interleaving means permutes the data bits by delaying the bits.

19. The permuted interleaving system according to claim 16 wherein the interleaving means includes a memory such that the data bits are read into memory address locations in one order, and read out of the memory address locations in a different permuted order.

* * * * *